United States Patent
Nakagawa et al.

(10) Patent No.: US 8,569,176 B2
(45) Date of Patent: Oct. 29, 2013

(54) SUBSTRATE PROCESSING METHOD

(75) Inventors: Akira Nakagawa, Nirasaki (JP); Yusuke Okazaki, Nirasaki (JP); Yoshinobu Hayakawa, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 274 days.

(21) Appl. No.: 13/069,733

(22) Filed: Mar. 23, 2011

(65) Prior Publication Data
US 2011/0237083 A1  Sep. 29, 2011

Related U.S. Application Data

(60) Provisional application No. 61/323,042, filed on Apr. 12, 2010.

(30) Foreign Application Priority Data

Mar. 26, 2010  (JP) ................................. 2010-072664

(51) Int. Cl.
*H01L 21/302* (2006.01)
*H01L 21/461* (2006.01)

(52) U.S. Cl.
USPC ............................. 438/706; 438/710; 438/714

(58) Field of Classification Search
None
See application file for complete search history.

(56) References Cited

U.S. PATENT DOCUMENTS

| 5,770,098 | A | * | 6/1998 | Araki et al. | 216/67 |
| 6,019,906 | A | * | 2/2000 | Jang et al. | 216/2 |
| 2008/0020583 | A1 | * | 1/2008 | Ueda et al. | 438/717 |
| 2010/0009542 | A1 | * | 1/2010 | Honda et al. | 438/702 |
| 2010/0291771 | A1 | * | 11/2010 | Zhou et al. | 438/710 |

FOREIGN PATENT DOCUMENTS

| CN | 1708838 A | 12/2005 |
| JP | 2007-180358 A | 7/2007 |

* cited by examiner

*Primary Examiner* — Duy Deo
(74) *Attorney, Agent, or Firm* — Abelman, Frayne & Schwab

(57) ABSTRACT

Disclosed is a substrate processing method configured to prevent the occurrence of a bowing shape to form a hole of a vertical processing shape on a mask layer, and to secure a remaining layer quantity as the mask layer. The substrate processing method receives a wafer W in which a mask layer and an intermediate layer are stacked on a target layer to be processed in a chamber, generates plasma of processing gas in the chamber, performs an etching process on wafer W using the plasma, thereby forming a pattern shape on the target layer to be processed through the intermediate layer and the mask layer. The etching process etches the mask layer by applying excitation power of 500 W for generating plasma, maintaining processing pressure at 5 mTorr ($9.31 \times 10^{-1}$ Pa) or less, and maintain temperature of wafer W in the range of $-10°$ C. to $-20°$ C.

21 Claims, 5 Drawing Sheets

SUBSTRATE PROCESSING METHOD

CROSS-REFERENCE TO RELATED APPLICATIONS

This application is based on and claims priority from Japanese Patent Application No. 2010-072664, filed on Mar. 26, 2010, with the Japanese Patent Office, the disclosure of which is incorporated herein in its entirety by reference. Also, this application claims the benefit of U.S. Provisional Application No. 61/323,042 filed on Apr. 12, 2010, with the United States Patent and Trademark Office, which is herein incorporated by reference in its entirety.

TECHNICAL FIELD

The present disclosure relates to a substrate processing method of forming a pattern shape on a substrate on which an amorphous carbon layer is disposed as a mask layer.

BACKGROUND

A wafer has been known for a semiconductor device where an oxide layer, a lower resist layer formed of an organic layer, a bottom anti-reflective coating (BARC) layer, etc., are stacked on a silicon substrate. In this configuration, the lower resist layer serves as a mask layer when the oxide layer is etched.

In recent use, while the miniaturization of the semiconductor device is progressed, a narrow pitch structure where the interval between holes is narrow has been applied in order to more finely form circuit patterns on a surface of the wafer. In order to form the circuit patterns having the narrow pitch structure, during the manufacturing process of the semiconductor device, there is a need to make the minimum dimension of patterns in the lower resist layer (hereinafter, referred to as a 'mask layer') formed with an organic layer small, and accurately transfer a small-dimensional opening part (hole) to the oxide layer that is a target layer to be processed.

In the substrate processing method processing the wafer including the amorphous carbon layer (hereinafter, referred to as an 'ACL layer') serving as the mask layer, a technology has been proposed for etching the ACL layer at a high etching rate and a high selectivity. See, for example, Publication of Japanese Patent Application Laid-Open No. 2007-180358.

However, the related art does not suggest any solutions to prevent the occurrence of bowing where a portion of a cross section of a hole expands in a mask layer. Accordingly, a hole shape of the mask layer which is an ACL layer becomes a bowing shape, such that the quantity of the remaining ACL layer becomes insufficient. Further, the ACL layer located between adjacent holes is collapsed to close the opening part of the hole, causing a case where the oxide layer that is a target layer to be processed may not be etched, which is problematic.

SUMMARY

An exemplary embodiment of the present disclosure provides a substrate processing method including receiving a substrate on which a mask layer and an intermediate layer are stacked over a target layer to be processed at a processing space; generating plasma of a processing gas in the processing space; and etching the substrate using the plasma, thereby forming a pattern shape in the target layer through the mask layer and the intermediate layer. In particular, the pressure in the processing space is maintained at 7 mTorr ($9.31 \times 10^{-1}$ Pa) or less, and the temperature of the substrate is maintained at 0° C. or less.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
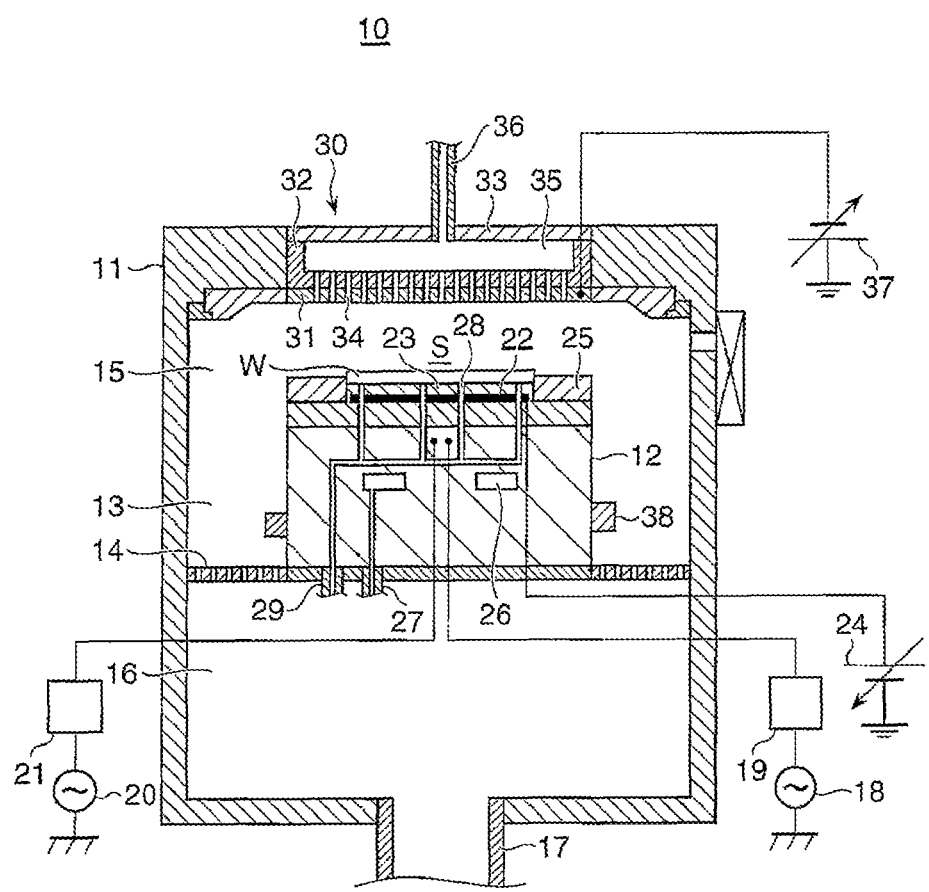
FIG. 1 is a cross-sectional view schematically showing the configuration of a substrate processing apparatus to which a substrate processing method, according to an exemplary embodiment of the present disclosure, is applied.

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

The present disclosure has been made in an effort to provide a substrate processing method capable of preventing the occurrence of a bowing shape where a portion of a cross section of a hole expands to form a hole of a vertical working shape on a mask layer, and securing a sufficient quantity of remaining layer as a mask layer.

In order to achieve the goals described above, an exemplary embodiment of the present disclosure provides a substrate processing method which includes receiving a substrate on which a mask layer and an intermediate layer are stacked over a target layer to be processed at a processing space; generating plasma of a processing gas in the processing space; and etching the substrate using the plasma, thereby forming a pattern shape in the target layer through the mask layer and the intermediate layer. In particular, the pressure in the processing space is maintained at 7 mTorr ($9.31 \times 10^{-1}$ Pa) or less, and temperature of the substrate is maintained at 0° C. or less.

In the substrate processing method described above, an excitation power for generating the plasma may be in the range of 450 W to 800 W, the pressure in the processing space may be 5 mTorr ($6.65 \times 10^{-1}$ Pa) or less, and the temperature of the substrate may be in the range of −10° C. to −20° C.

In the substrate processing method described above, the excitation power may also be in the range of 450 W to 550 W, and the bias power for infusing the plasma to the substrate may be 0 W.

Another exemplary embodiment of the present disclosure provides a substrate processing method which includes receiving a substrate on which a mask layer and an intermediate layer are stacked over a target layer to be processed at a processing space formed between an upper electrode and a lower electrode; generating plasma of a processing gas in the processing space; and etching the substrate using the plasma, thereby forming a pattern shape in the target layer through the mask layer and the intermediate layer. In particular, the etching includes a first etching step adapted to etch the mask layer by applying a DC voltage in the range of −150 to −600 V to the upper electrode, maintaining pressure in the processing space at 7 mTorr ($9.31 \times 10^{-1}$ Pa) or less, and maintaining an excitation power for generating the plasma in the range of 450 W to 800 W. The etching further includes a second etching step adapted to etch the mask layer by applying a DC voltage of 0 V to the upper electrode, maintaining the pressure in the processing space at 7 mTorr ($9.31 \times 10^{-1}$ Pa) or less, and maintaining the excitation power in the range of 450 W to 800 W.

In the substrate processing method as described above, the pressure in the processing space in each of the first and second etching steps may be 5 mTorr ($6.65 \times 10^{-1}$ Pa) or less, and the excitation power in the first and second etching steps may be in the range of 450 W to 550 W.

Yet another exemplary embodiment of the present disclosure provides a substrate processing method which includes receiving a substrate on which a mask layer and an intermediate layer are stacked over a target layer to be processed at a processing space; generating plasma of a processing gas in the processing space; and etching the substrate using the plasma, thereby forming a pattern shape in the target layer through the mask layer and the intermediate layer. In particular, the etching includes a third etching step adapted to etch the mask layer by applying a first excitation power for generating the plasma, and maintaining pressure in the processing space at 7 mTorr ($9.31 \times 10^{-1}$ Pa) or less. The etching further includes a fourth etching step adapted to etch the mask layer by applying a second excitation power lower than the first excitation power, and maintaining pressure in the processing space at 7 mTorr ($9.31 \times 10^{-1}$ Pa) or less.

In the substrate processing method described above, each of the first excitation power and the second excitation power may be in the range of 2100 W to 1900 W and in the range of 1600 W to 1400 W, respectively.

In the substrate processing method described above, the etching process may further include a fifth etching step adapted to etch the mask layer by applying a third excitation power lower than the second excitation power, and maintaining pressure in the processing space at 7 mTorr ($9.31 \times 10^{-1}$ Pa) or less.

In the substrate processing method described above, the third excitation power may be in the range of 1100 W to 900 W, and the pressure in the processing space may be 5 mTorr ($6.65 \times 10^{-1}$ Pa) or less.

In the substrate processing method described above, the mask layer may be an amorphous carbon layer, and the processing gas may be a mixed gas containing oxygen ($O_2$) gas and COS gas. In particular, the ratio of the COS gas to the mixed gas may be in the range of 4.8 to 9.1 volume %.

According to the present disclosure described above, the exemplary embodiment of the present disclosure prevents the occurrence of the bowing shape in which a portion of the cross section of the hole expands, thereby forming the hole having a vertical working shape on the mask layer, and securing the sufficient quantity of the remaining layer as the mask layer.

Hereinafter, exemplary embodiments of the present disclosure will be described in detail with reference to the accompanying drawings.

FIG. 1 is a cross-sectional view schematically showing the configuration of a substrate processing apparatus to which a substrate processing method, according to an exemplary embodiment of the present disclosure, is applied. The substrate processing apparatus performs predetermined plasma etching processes on a semiconductor wafer (hereinafter, simply referred to as a 'wafer').

In FIG. 1, a substrate processing apparatus 10 includes a chamber 11 accommodating a wafer W, and a circumferential-shape susceptor 12 configured to dispose wafer W is provided in chamber 11. Side exhausting paths 13 are formed by inner side walls of chamber 11 and side portions of susceptor 12. An exhausting plate 14 is disposed in the middle of side exhausting paths 13.

Exhausting plate 14, which is a plate-shaped member having a plurality of through holes, serves as a partition plate that partitions the inside of chamber 11 into an upper portion and a lower portion. As described below, plasma is generated at upper portion 15 (hereinafter, referred to as a 'processing chamber') of chamber 11 partitioned by exhausting plate 14. In addition, an exhausting pipe 17 discharging gas in chamber 11 is connected to lower portion 16 (hereinafter, referred to as an 'exhausting chamber (manifold)') of chamber 11. Exhausting plate 14 captures or reflects the plasma generated in processing chamber 15 to prevent the plasma from being leaked to manifold 16.

Exhausting pipe 17 is connected with a turbo molecular pump (TMP) and a dry pump (DP) (not shown), and these pumps make the inside of chamber 11 into a vacuum state to reduce the pressure in chamber 11 to a predetermined pressure. Further, the pressure in chamber 11 is controlled by an adaptive pressure control (APC) valve (not shown).

A first high frequency power supply 18 is connected to susceptor 12 in chamber 11 through a first rectifier 19, and a second high frequency power supply 20 is connected therewith through a second rectifier 21. First high frequency power supply 18 applies a high frequency power of a relatively low frequency, for example, 3 MHz to susceptor 12 as a bias power, and second high frequency power supply 20 applies a high frequency power of a relatively high frequency, for example, 40 MHz to susceptor 12 for generating plasma. Therefore, susceptor 12 serves as an electrode. In addition, first rectifier 19 and second rectifier 21 reduce the reflection of the high frequency power from susceptor 12 to maximize the application efficiency of the high frequency power to susceptor 12.

An electrostatic chuck 23 having an electrostatic electrode plate 22 provided therein is disposed on the top of susceptor 12. Electrostatic chuck 23 includes a step and is made of ceramics.

A DC power supply 24 is connected to electrostatic electrode plate 22, and when a positive DC voltage is applied to electrostatic electrode plate 22, a negative potential is generated on the surface of wafer W (a rear surface) facing a side of electrostatic chuck 23 to generate electric field between electrostatic electrode plate 22 and the rear of wafer W. In this case, wafer W is adsorbed and maintained into electrostatic chuck 23 by Coulomb force or Johnsen-Rahbeck force generated by the electric field.

In addition, a focus ring 25 is disposed on a horizontal portion at the step of electrostatic chuck 23 in order to surround wafer W that is adsorbed and maintained. Focus ring 25 is made of, for example, silicon carbide (SiC).

The inside of susceptor 12 is provided with an annular refrigerant passage 26 that extends in, for example, a circumferential direction. A low-temperature refrigerant, for example, cooling water or Galden (registered trademark), is cyclically supplied to refrigerant passage 26 through a pipe 27 from a chiller unit (not shown). Susceptor 12 cooled by the refrigerant cools wafer W and focus ring 25 through electrostatic chuck 23.

A portion of electrostatic chuck 23 (an adsorption surface) into which wafer W is adsorbed and maintained is provided with a plurality of opened heat conduction gas supply holes 28. Heat conduction gas supply holes 28 are connected to a heat conduction gas supply part (not shown) through a heat conduction gas supply line 29, and the heat conduction gas supply part supplies helium (He) gas as a heat conduction gas to a gap between the adsorption surface and the rear of wafer W through heat conduction gas supply holes 28. The He gas supplied to the gap between the adsorption surface and the rear of wafer W effectively transfers the heat of wafer W to electrostatic chuck 23.

A shower head 30 is disposed to oppose susceptor 12 in the ceiling portion of chamber 11 through a processing space S of processing chamber 15. Shower head 30 includes an upper electrode plate 31, a cooling plate 32 removably hanging upper electrode plate 31, and a cover 33 covering cooling plate 32. Upper electrode plate 31 is formed with a disk-shaped member having a plurality of gas holes 34 penetrating therethrough in a thickness direction, and is made of silicon carbide (SiC) that is a semiconductor. Further, the inside of cooling plate 32 is provided with a buffer chamber 35 which is connected to a gas introduction pipe 36.

Further, upper electrode plate 31 of shower head 30 is connected with a DC power supply 37, which applies a negative DC voltage to upper electrode plate 31. In this case, upper electrode plate 31 emits secondary electrons to prevent the electron density from being reduced on a space located above wafer W in processing chamber 15. The emitted secondary electrons flow into a ground electrode 38 (grand ring) from the space located above wafer W, wherein ground electrode 38 is made of a semiconductor material such as silicon carbide (SiC) or silicon (Si), and is prepared to surround the side of susceptor 12 in side exhausting path 13.

In substrate processing apparatus 10 having the above configuration, the processing gas supplied to buffer chamber 35 from processing gas introduction pipe 36 is introduced into processing chamber 15 through gas hole 34 of upper electrode plate 31. And the introduced processing gas is excited by the high frequency power for generating the plasma applied to the inside of processing chamber 15 through susceptor 12 from second high frequency power supply 20. The processing gas then becomes plasma. Ions in the plasma are introduced to wafer W by the high frequency power for a bias applied to susceptor 12 by first high frequency power supply 18, and wafer W is subjected to the plasma etching processing.

Figure 2:
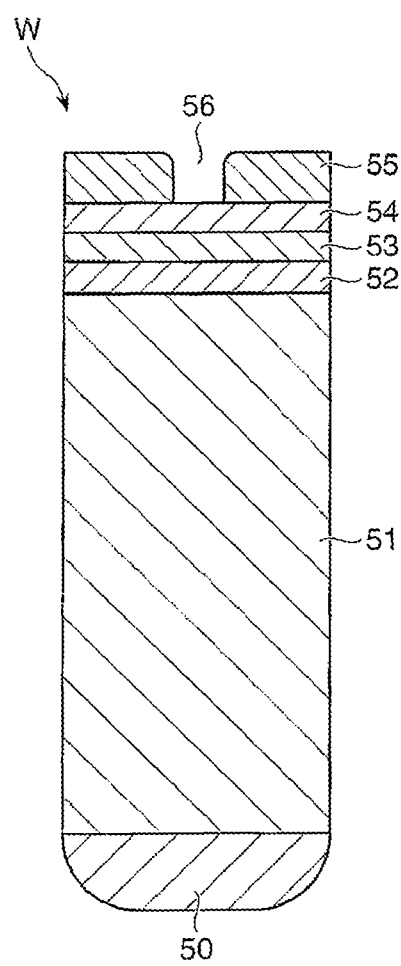
FIG. 2 is a cross-sectional view schematically showing the configuration of a semiconductor wafer subjected to a plasma processing in a substrate processing apparatus of FIG. 1.

FIG. 2 is a cross-sectional view schematically showing the configuration of the semiconductor wafer subjected to the plasma processing in the substrate processing apparatus of FIG. 1.

In FIG. 2, wafer W includes a $SiO_2$ layer 51 (oxide layer) formed on a surface of a silicon substrate 50, an ACL layer 52 (amorphous carbon layer), a SiON layer 53 (hard mask layer), a BARC layer 54 (bottom anti-reflective coating layer), and a photoresist layer 55 that are sequentially stacked on $SiO_2$ layer 51.

Silicon substrate 50 is a disk-shaped thin plate made of silicon, and, is subjected to, for example, a thermal oxidation processing, to form $SiO_2$ layer 51 on the surface thereof, and form ACL layer 52 on $SiO_2$ layer 51. ACL layer 52 is a mask layer and serves as the lower resist layer. SiON layer 53 is formed on the surface of ACL layer 52 by performing CVD processing or PVD processing, and BARC layer 54 is formed on SiON layer 53 by, for example, a coating process. BARC layer 54 is made of a polymer resin including a pigment absorbing light having a specific wavelength, for example, an ArF excimer laser light irradiated toward photoresist layer 55. Additionally, BARC layer 54 prevents the ArF excimer laser light transmitting photoresist layer 55 from arriving at photoresist layer 55 again by being reflected from SiON layer 53 or ACL layer 52. Photoresist layer 55 is formed on BARC layer 54 by, for example, a spin coating (not shown). Photoresist layer 55 is made of a positive type photosensitive resin, and is modified into alkali solubility when being irradiated with the ArF excimer laser light.

In connection with wafer W having the above configuration, the ArF excimer laser light corresponding to a pattern inverted into the predetermined pattern is irradiated to photoresist layer 55 by a stepper (not shown), such that a portion irradiated with the ArF excimer laser light in photoresist layer 55 is modified into an alkali solubility. Thereafter, a strong alkaline developer is dropped to photoresist layer 55 to remove the portion modified into the alkali solubility. Therefore, the portion corresponding to the pattern inverted into the predetermined pattern is removed from photoresist layer 55, such that photoresist layer 55 having opening part 56 remains at a position of wafer W at which the hole indicating the predetermined pattern is formed on wafer W.

Thereafter, opening part 56 is transferred to BARC layer 54 as a sequential anti-reflective coating, SiON layer 53 as a hard mask layer, and ACL layer 52 as a mask layer, and a hole having a predetermined opening width is finally formed on $SiO_2$ layer 51.

Meanwhile, in order to satisfy the recent demand for miniaturization of the semiconductor device, it is required to form a hole having an excellent vertical working shape suppressing the occurrence of the bowing shape on wafer W. However it is not always easy to form the hole having an excellent vertical working shape on the mask layer by preventing the occurrence of the bowing shape in which a portion of the cross section of the hole expands, especially during the recent etching process of wafer W in which a relatively thin mask layer is applied.

Various experiments have been performed specially with respect to ACL layer 52, in order to establish the substrate processing method capable of forming the hole having an excellent vertical working shape by suppressing the occurrence of the bowing shape in wafer W having BARC layer 54 as the intermediate layer, and SiON layer 53 and ACL layer 52 as the mask layer.

(1) The present disclosure was implemented by finding that the mask layer is etched using a mixed gas of $O_2$ gas and COS (carbonyl sulfide) gas as the processing gas, and, at the pressure of 7 mTorr ($9.31 \times 10^{-1}$ Pa) or less in the processing space, and at the substrate temperature of 0° C. or less to prevent the occurrence of the bowing shape, and, as a result, the hole having an excellent vertical working shape may be formed on the mask layer and the sufficient remaining layer quantity may be secured as the mask layer. In the present disclosure, the exciting power for generating the plasma may be I the range of 450 W to 800 W.

(2) In addition, the present disclosure has been implemented by finding that the occurrence of the bowing shape is prevented by performing a mask layer etching process including a first etching step etching the mask layer using a mixed gas of $O_2$ gas and COS (carbonyl sulfide) gas as the processing gas, at the pressure of 7 mTorr ($9.31 \times 10^{-1}$ Pa) or less in the processing space, and at an excitation power in the range of 450 W to 800 W, and applying a DC voltage in the range of −150 to −600 v to the upper electrode. The mask layer etching process further includes a second etching step etching the mask layer at the pressure of 7 mTorr ($9.31 \times 10^{-1}$ Pa) or less in the processing space, and at an excitation power in the range of 450 W to 800 W without applying a DC voltage to the upper electrode, thereby making it possible to form the hole having an excellent vertical working shape on the mask layer and secure the sufficient remaining layer quantity as the mask layer.

(3) In addition, the present disclosure has been implemented by finding that the occurrence of the bowing shape is prevented by performing a mask layer etching process including a third etching step etching the mask layer using a mixed gas of $O_2$ gas and COS (carbonyl sulfide) gas as the processing gas, at the pressure of 7 mTorr ($9.31 \times 10^{-1}$ Pa) or less in the processing space, and applying a first excitation power. The mask layer etching process further includes a fourth etching step etching the mask layer at the pressure of 7 mTorr ($9.31 \times 10^{-1}$ Pa) or less in the processing space, and applying a second excitation power lower than the first excitation power, thereby making it possible to form the hole having an excellent vertical working shape on the mask layer, and sufficiently secure the remaining layer quantity as the mask layer.

Hereinafter, the substrate processing method according to the first exemplary embodiment of the present disclosure will be described in detail. The processing is executed by a system controller (not shown) of substrate processing apparatus 10 according to a substrate processing recipe that is a program for processing the substrate in chamber 11 of substrate processing apparatus 10.

The substrate processing method includes a mask layer etching process utilizing a lower excitation power for generating plasma at a relatively lower pressure and temperature, as compared with the mask layer etching process according to the related art.

Figure 3:
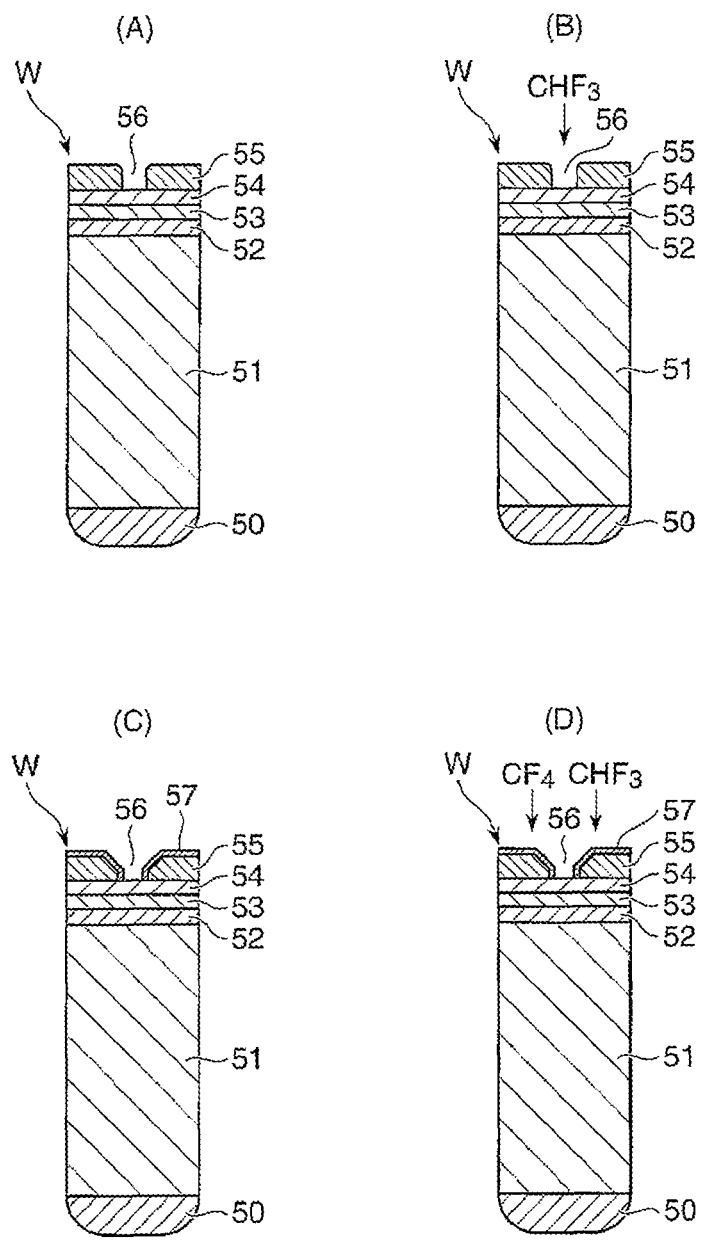
FIGS. 3A, 3B, 3C, 3D each shows a process diagram showing a substrate processing method, according to a first exemplary embodiment of the present disclosure.

FIG. 3 is a process diagram showing the substrate processing method, according to the first exemplary embodiment of the present disclosure.

In FIG. 3, $SiO_2$ layer 51, ACL layer 52 as a mask layer, SiON layer 53 as a hard mask layer, BARC layer 54, and photoresist layer 55 are sequentially stacked on silicon substrate 50. Additionally, photoresist layer 55 is provided with wafer W having opening part 56 that exposes a portion of BARC layer 54 at an opening width, for example, 60 nm, as shown in FIG. 3A of the present disclosure. Further, wafer W is carried into chamber 11 of substrate processing apparatus 10, as shown in FIG. 1, and is disposed on susceptor 12.

Subsequently, the pressure of chamber 11 is set to, for example, 75 mTorr ($1.0 \times 10$ Pa) using a valve such as the APC valve (not shown). In addition, the temperature of wafer W is set to, for example, 50° C. Further, $CHF_3$, which is a deposition gas from gas hole 34 of upper electrode plate 31 of shower head 30, is supplied into chamber 11 at a flow rate of, for example, 300 sccm. Further, the excitation power of 750 W and the bias power of 300 W are applied to susceptor 12, and DC voltage of −300 V is applied to shower head 30. In this case, the $CHF_3$ gas is excited by the high frequency power applied to processing space S, and, thus, becomes plasma, generating ions or radicals, as shown in FIG. 3B of the present disclosure. The ions or the radicals collide and react with the surface of photoresist layer 55 or the side wall surface of the opening part to form a deposition layer 57 on the collided and reacted portion, as shown in FIG. 3C of the present disclosure. In this case, the width of opening part 56 is reduced (shrink) up to, for example, 40 nm.

Thereafter, wafer W including photoresist layer 55 having opening part 56 of which the opening width is reduced, is subjected to the etching processing that transfers the opening part formed on photoresist layer 55 to ACL layer 52.

That is, after the pressure in chamber 11 accommodating wafer W of which the width of opening part 56 is reduced, is set to, for example, 75 mTorr ($1 \times 10$ Pa) by the APC valve (not shown), the temperature of wafer W is set to, for example, 50° C., $CF_4$ gas is supplied into chamber 11 at a flow rate of 220 sccm from gas hole 34 of upper electrode plate 31 of shower head 30, and $CHF_3$ gas is supplied into chamber 11 at a flow rate of 250 sccm. Further, the excitation power of 750 W and the bias power of 0 W are applied to susceptor 12, and DC voltage of −300 V is applied to shower head 30. In this case, the $CF_4$ gas and $CHF_3$ gas become plasma by the high frequency power applied to processing space S, and ions or radicals are generated, as shown in FIG. 3D of the present disclosure. The ions or the radicals collide and react with a portion that is not covered by photoresist layer 55 in BARC layer 54 to etch BARC layer 54 and the corresponding portion of SiON layer 53 thereunder. BARC layer 54 and SiON layer 53 of the portion are etched until ACL layer 52 is exposed, as shown in FIG. 4E of the present disclosure.

As described above, after BARC layer 54 and SiON layer 53 are etched, the mask layer etching process is performed that is a characteristic etching process in the present substrate processing method.

In the mask layer etching process, the pressure of chamber 11 is set to, for example, 5 mTorr ($6.65 \times 10^{-1}$ Pa) using a valve such as the APC valve. In addition, the temperature of the lower portion of wafer W is set to, for example, −10° C. The COS gas containing gas that is a mixture of $O_2$ gas of 200 sccm and 17 sccm of COS gas (i.e., the ratio of the COS gas flux to the entire processing gas flux is 7.8 volume %) is supplied into chamber 11 from gas hole 34 of upper electrode plate 31 of shower head 30. Further, as the excitation power for generating plasma in susceptor 12, the high frequency power of, for example, 40 MHz is applied at 500 W, and the bias power of, for example, 3 MHz, is applied at 0 W. In addition, the DC voltage is not applied to shower head 30 serving as the upper electrode. In this case, $O_2$ gas and COS gas become plasma by the high frequency power applied to processing space S, and ions or radicals are generated, as shown in FIG. 4F of the present disclosure.

Figure 4:
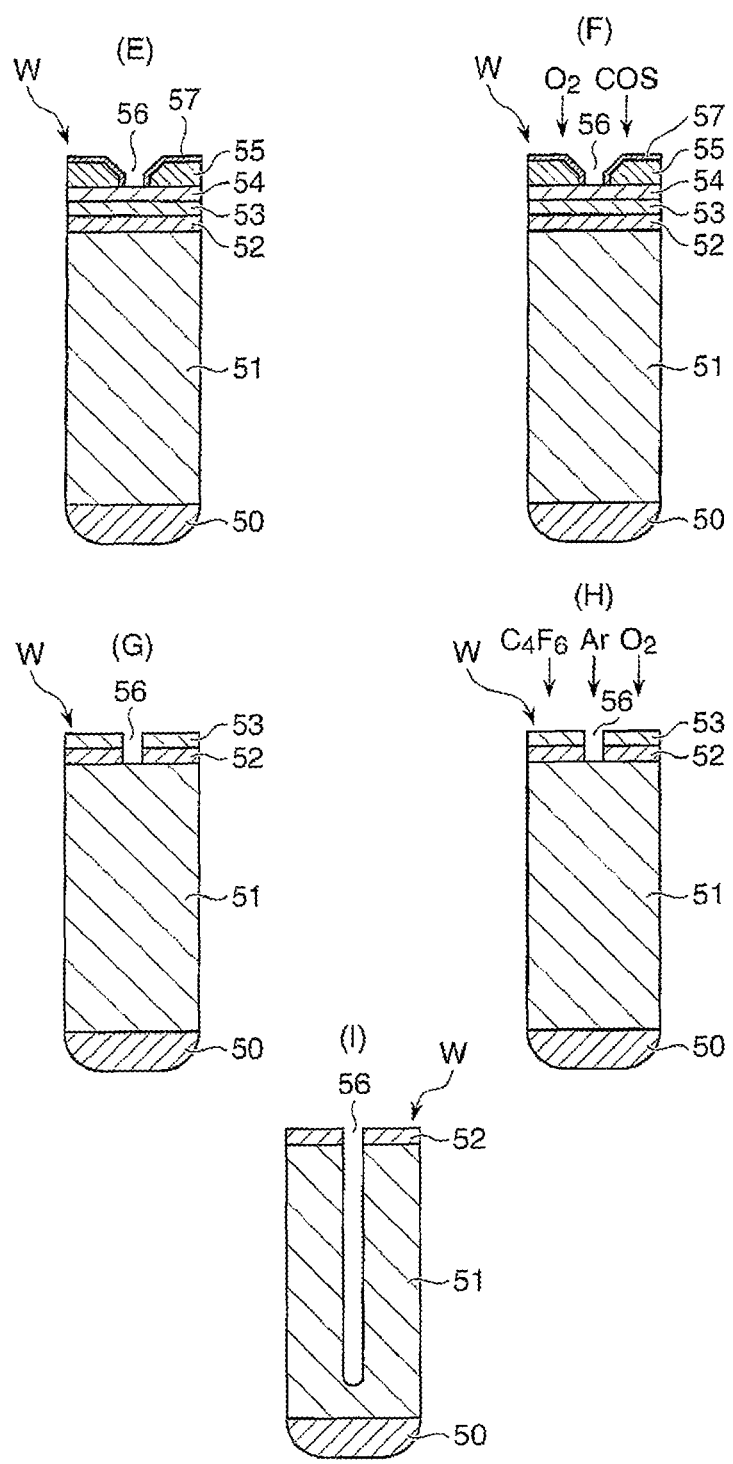
FIGS. 4E, 4F, 4G, 4H, 4I each shows a process diagram showing the substrate processing method, according to the first exemplary embodiment of the present disclosure.

The ions or the radicals collide and react with ACL layer 52 to etch the corresponding portion, as shown in FIG. 4G of the present disclosure. ACL layer 52 of the corresponding portion is etched until $SiO_2$ layer 51 is exposed, and an opening part 56 having the width of, for example, 40 nm, is formed on ACL layer 52. In this case, photoresist layer 55, deposition layer 57 deposited on the side wall surface and the top surface of opening part 56 of photoresist layer 55, and BARC layer 54 are simultaneously removed. Further, the hole having an excellent vertical working shape without the bowing is formed on ACL layer 52, and the sufficient remaining layer quantity required when lower $SiO_2$ layer 51 is etched, can be secured. In addition, the etching time of ACL layer 52 is, for example, 181 sec.

Figure 5:
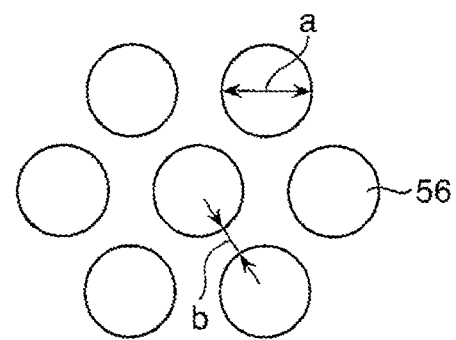
FIG. 5 is a diagram showing a cross section of an opening part formed on an ACL layer in the first exemplary embodiment of the present disclosure.

FIG. 5 is a diagram showing the cross section of the opening part formed on ACL layer 52 after the mask layer etching process is completed. In FIG. 5, ACL layer 52 is formed with a plurality of opening parts 56 having a substantially uniform hole diameter.

The hole diameter (a) is, for example, about 40 to 50 nm and the hole interval (b) is, for example, about 37 nm. In addition, an aspect ratio is, for example, 20 or more.

Next, the pressure of chamber 11 accommodating wafer W in which ACL layer 52 is etched, is set to, for example, 20 mTorr (2.66 Pa) by using a valve such as the APC valve. In addition, the upper temperature of wafer W is set to, for example, 95° C., and the lower temperature of wafer W is set to, for example, 20° C. Further, the $C_6F_6$ containing gas that is a mixture of $C_6F_6$ gas of, for example, 12 sccm, $C_4F_6$ gas of, for example, 25 sccm, $C_4F_8$ gas of, for example, 20 sccm, Ar gas of, for example, 200 sccm, and $O_2$ gas of, for example, 85 sccm, is supplied into chamber 11 from gas hole 34 of upper electrode plate 31 of shower head 30. The excitation power with 40 MHz and 1700 W, and the bias power with 3 MHz and 4500 W are applied to susceptor 12. In this case, the $C_6F_6$ gas, $C_4F_6$ gas, $C_4F_8$ gas, Ar gas, and $O_2$ gas become plasma by the high frequency power applied to processing space S, and ions or radicals are generated, as shown in FIG. 4H of the present disclosure. The ions or the radicals collide and react with $SiO_2$ layer 51 to etch the corresponding portion.

In this case, a layer caused by the $C_6F_6$ gas is deposited on ACL layer 52 and SiON layer 53, and serves as the mask layer. Therefore, the etching is progressed while securing the residuals of the film thickness, and, thus, the hole having an excellent vertical working shape is also formed on $SiO_2$ layer 51, while avoiding the bowing shape without swelling the side of the hole of opening part 56.

Next, wafer W in which the hole having an excellent vertical working shape is formed on $SiO_2$ layer 51 without the bowing shape, is subjected to a separate device, that is, an asher to remove ACL layer 52 serving as the mask layer, thereby completing a series of etching processes.

According to the present exemplary embodiment, ACL layer 52 is etched in the mask layer etching process at a relatively lower pressure of 5 mTorr ($6.65 \times 10^{-1}$ Pa) in the processing space and at a relatively lower temperature of the substrate of $-10°$ C. to $-20°$ C., as compared to the related art. Also, the excitation power of 500 W is used for generating plasma. As a result, the bowing shape expanding a portion of the cross section of the hole of opening part 56 in ACL layer 52 is prevented to form the hole having an excellent vertical working shape, and the sufficient remaining quantity may be secured as the mask layer, according to the synergistic effect described below. Further, in the subsequent etching process of $SiO_2$ layer 51, the hole having an excellent vertical shape may be formed in which the top view is excellent and having no distortion on the lower portion.

In the present exemplary embodiment, in the mask layer etching process, the pressure of processing space S is set to 7 mTorr ($9.31 \times 10^{-1}$ Pa) or less, 5 mTorr ($6.65 \times 10^{-1}$ Pa) or less, and generally 5 mTorr ($6.65 \times 10^{-1}$ Pa) to 7 mTorr ($9.31 \times 10^{-1}$ Pa), that is lower than the processing pressure of the related art which may be, for example, 20 mTorr (2.66 Pa). Therefore, the molecular density in plasma is lowered in processing space S, the ion scattering due to the collision of molecules is decreased, and the incident angle of ions to the side wall of the hole of ACL layer 52 becomes small.

Further, ions are mainly incident into the hole vertically downwardly, and an attack force of ions to the side wall becomes small, such that the bowing is reduced and the hole having an excellent vertical working shape is formed. Meanwhile, when the processing pressure exceeds 7 mTorr ($9.31 \times 10^{-1}$ Pa), the incident angle of the ions to the side wall of the hole does not become sufficiently small, and the attack force to the side wall of the hole is increased, such that the bowing is easily generated. Therefore, when the processing pressure is in the above range, the incident angle of ions in plasma to the hole becomes small, such that the hole having an excellent vertical working shape may be formed.

In the present exemplary embodiment, in the mask layer etching process, the wafer temperature is set to 0° C. or less, and may be in the range of $-10°$ C. to $-20°$ C. This temperature is lower than the wafer temperature employed in the mask layer etching process according to the related art which is, for example, 20° C. The etching rate in the horizontal direction is further reduced than the etching rate in the depth direction of the hole by lowering the temperature of the wafer, such that the occurrence of the bowing may be suppressed. In this case, while the etching of the depth direction of the hole has mainly been progressed by the collision of ions, the etching in the side wall direction has been progressed mainly depending on the amount of heat of the ions attached to the side wall of the hole. Therefore, the etching amount in the side wall direction becomes smaller than the etching amount in the depth direction of the hole by lowering the processing temperature which is the wafer temperature during the processing, such that opening part 56 having an excellent vertical workability may be formed. Meanwhile, when the wafer temperature exceeds 0° C., the reduction effect of the etching rate in the side wall direction is insufficient when the ions are attached to the side wall of the hole. Therefore, when the wafer temperature is in the range of $-10°$ C. to $-20°$ C., the etching rate in the side wall direction is selectively reduced as compared with the etching rate in the depth direction of the hole, thereby making it possible to form the hole having an excellent vertical working shape.

In the present exemplary embodiment, in the mask layer etching process, the excitation power for generating plasma is lower than the excitation power employed in the related art which is, for example, 2000 W, 450 W to 800 W, and 450 W to 550 W. Therefore, the energy incident to the side wall of the hole becomes small and the bowing is reduced, such that opening part 56 having an excellent vertical working shape may be formed. The etching rate in the depth direction of the hole becomes also small by setting the excitation power within the above range. However, the etching amount for the side wall of the hole becomes considerably small when opening part 56 having a desired depth is formed by making the etching time longer as compared with the case where the excitation power is larger than 800 W, such that opening part 56 having an excellent vertical working shape may be formed without the bowing. Meanwhile, where the excitation power exceeds 800 W, the degradation amount in energy in the side wall direction of the hole is insufficient, such that there is a risk of the occurrence of the bowing. In the exemplary embodiment, the excitation power is generally controlled in the range of 450 W to 550 W. In this range, the bowing expanding the cross section of the hole may be suppressed by reducing the etching rate in the side wall direction of the hole without extremely lowering the etching rate in the depth direction of the hole.

In the exemplary embodiment, the bias power in the mask layer etching process is set to be 0 W. That is, the bias power is not applied. Therefore, the plasma is introduced into wafer W according to the self bias voltage only. Therefore, the remaining layer quantity of ACL layer 52 may be secured.

In the exemplary embodiment, the ratio of the COS gas in the mixed gas including the $O_2$ gas and the COS gas may be 4.8 to 9.1 volume %. As a result, it is possible to prevent the diameter of the inlet portion of the hole from being expanded due to, for example, the smoothing effect.

In the exemplary embodiment, although the substrate processing apparatus of the lower 2 frequency is used as the substrate processing apparatus, it is not limited thereto. For example, the exemplary embodiment may be executed using the substrate processing apparatus of the upper and lower 2 frequency.

Next, a substrate processing method according to a second exemplary embodiment of the present disclosure will be described.

The second exemplary embodiment is different from the first exemplary embodiment with respect to the mask layer etching process, and other processes, such as the shrink process, the BARC layer and SiON layer etching process, the SiO$_2$ layer etching process after the mask layer etching process are similar to the first exemplary embodiment.

Hereinafter, the mask layer etching process of the second exemplary embodiment which is mainly different from that of the first exemplary embodiment will be described.

In the second exemplary embodiment, the mask layer etching process includes a first etching step in which DC voltage in the range of −150 to −600 V is applied to upper electrode (shower head) 30 under condition that the processing pressure is set to 7 mTorr ($9.31 \times 10^{-1}$ Pa) or less, and the excitation power of generating plasma is set in the range of 450 W to 800 W. The mask layer etching process also includes a second etching step in which DC voltage of 0 V is applied to shower head 30, that is, the DC voltage that is not applied to shower head, under condition that the processing pressure is set to 7 mTorr ($9.31 \times 10$−1 Pa) or less, and the excitation power is set to in the range of 450 W to 800 W.

First, the first etching step is performed by making the pressure of chamber 11, receiving wafer W, as shown in FIG. 4E on which BARC layer 54 and SiON layer 53 are etched, into 5 mTorr ($6.65 \times 10^{-1}$ Pa) until a portion of ACL layer 52 is exposed, making the lower temperature of wafer W to be 20° C., applying DC voltage of −600 V to shower head 30, and supplying the mixed gas of O$_2$ gas of 200 sccm and COS gas of 17 sccm into chamber 11 from gas hole 34 of upper electrode plate 31. And, in this state, the high frequency power of 500 W of, for example, 40 MHz, is applied to susceptor 12 as the excitation power under condition that the bias power is set to 0 W. In this case, O$_2$ gas and COS gas become plasma by the high frequency power applied to processing space S, and ions or radicals are generated, as shown in FIG. 4F of the present disclosure.

Then, after the predetermined time elapses, among the etching conditions in the first etching step, only the DC voltage applied to shower head 30 is changed into 0 V to conduct the second etching step, while maintaining the other conditions the same as in the first etching step.

The generated ions or radicals collide and react with ACL layer 52 to etch the corresponding portion, as shown in FIG. 4G of the present disclosure. ACL layer 52 of the corresponding portion is etched until SiO$_2$ layer 51 is exposed, and the hole having an excellent vertical working shape of which the opening diameter is, for example, 40 nm, is formed on ACL layer 52 without the bowing. In addition, the sufficient quantity of remaining layer required to etch lower SiO$_2$ layer 51 can be secured.

According to the second exemplary embodiment, in the first etching step of the mask layer etching process, the DC voltage is applied to shower head 30 while setting the bias power to 0 W. Therefore, the plasma density is increased and the deposition becomes easy on SiON layer 53. The deposition serves as a protective layer. Therefore, opening part 56 in SiON layer 53 is prevented from being formed into a taper shape, and the ions incident to the side wall of ACL layer 52 are decreased, such that the occurrence of the bowing may be suppressed and the hole having an excellent vertical working shape may be formed. In addition, the quantity of remaining layer may be sufficiently secured as the mask layer.

In the second exemplary embodiment, while the mechanism that does not make opening part 56 of SiON layer 53 to be tapered is not clear, several factors are considered to be the reason. For example, the deposition layer is accumulated on SiON layer 53 to serve as a protection layer, and the introduction amount of ions is decreased because the bias power is set to 0 W and the ions are introduced only by the self bias voltage. Moreover, the sputtering is becoming weakened on the surface of SiON layer 53.

In the second exemplary embodiment, subsequently to the first etching step of the mask layer etching process, the second etching step is performed in which the DC voltage is not applied to shower head 30. When the first etching step is continued by applying the DC voltage, the accumulation amount of the deposition layer becomes too much, and the diameter of the hole of ACL layer 52, which is the etching target, becomes narrow, such that the lower critical dimension (CD) may not be secured. Therefore, in the second exemplary embodiment, next to the first etching step applying the DC voltage to shower head 30, the second etching step is performed without applying the DC voltage. Therefore, the deposition is suppressed by reducing the plasma density, such that the sputtering of the surface of SiON layer 53 becomes superior, thereby securing the lower diameter.

In the second exemplary embodiment, the processing times of the first etching step and the second etching step is, for example, 120 sec and 86 sec, respectively, in the mask layer etching process. The processing time of the first process and the second process depends on the diameter of the hole to be formed on, for example, ACL layer 52, but each processing time and the conversion timing from the first process into the second process are determined based upon the experience, or the like, that repeatedly performs the same etching process.

In the second exemplary embodiment, making the processing pressure in the mask layer etching process into the lower pressure than the processing pressure of the related art which is, for example, 20 mTorr (2.66 Pa), and making the excitation power for generating plasma into lower power than the excitation power of the related art which is, for example, 2000 W are similar to the first exemplary embodiment. Also, the proper range of these parameters is also similar to the first exemplary embodiment.

Next, a substrate processing method according to a third exemplary embodiment of the present disclosure will be described.

The third exemplary embodiment is different from the first exemplary embodiment in the mask layer etching process, and the other processes are similar to those of the first exemplary embodiment.

Hereinafter, the mask layer etching process of the third exemplary embodiment different from that of the first exemplary embodiment will be mainly described.

In the third exemplary embodiment, the mask layer etching process includes a third etching step in which the first excitation power for generating plasma is applied under condition that the processing pressure is set to 7 mTorr ($9.31 \times 10^{-1}$ Pa) or less, and a fourth etching step in which the second excitation power lower than the first excitation power is applied under condition that the processing pressure is set to be 7 mTorr ($9.31 \times 10^{-1}$ Pa) or less.

In order words, in the mask layer etching process according to the third exemplary embodiment, the third etching step is performed by supplying the mixed gas of O$_2$ gas of 200 sccm and the COS gas of 17 sccm into chamber 11 from gas hole 34 of upper electrode plate 31 under condition that the pressure in chamber 11 receiving wafer W, as shown in FIG. 4E, on which BARC layer 54 and SiON layer 53 are etched, is set to 5 mTorr ($6.65 \times 10^{-1}$ Pa) until a portion of ACL layer 52 is exposed, and the lower temperature of wafer W is set to 20° C.

And in this state, the high frequency power of 2000 W of 40 MHz is applied to susceptor 12 as the excitation power for generating plasma, and the bias power is set to 0 W. In this case, $O_2$ gas and COS gas become plasma by the high frequency power applied to processing space S, and ions or radicals are generated, as shown in FIG. 4F of the present disclosure.

Next, after the predetermined time elapses, among the etching conditions in the third etching step, only the excitation power becomes 1500 W, and the fourth etching step is performed while maintaining the other conditions the same as they are.

The generated ions or radicals collide and react with ACL layer 52 to etch the portion thereof, as shown in FIG. 4G of the present disclosure. The portion of ACL layer 52 is etched until $SiO_2$ layer 51 is exposed, and opening part 56 of which the width is, for example, 40 nm, is formed on ACL layer 52. In this case, the excitation power is changed in the third etching step and the fourth etching step to change the incident angle of the ions incident to the wall surface of the hole, such that the bowing generation position is changed in the side of the hole of ACL layer 52. As described above, the incident angle of the ions to the hole having the high energy is changed by combining the etching processes by which the bowing occurs at different positions, and the bowing position is dispersed. As a result, the occurrence of the bowing is suppressed.

According to the third exemplary embodiment, in the third etching step and the fourth etching step in the mask layer etching process, since the excitation power for generating plasma is changed and the etching processes by which the bowing occurs at different positions are combined, the occurrence of the bowing in which a portion of the cross section of the hole expands may be suppressed, and the hole having an excellent vertical working shape may be formed on ACL layer 52. Also, a sufficient quantity of remaining layer may be secured as the mask layer.

In the present exemplary embodiment, the excitation power in the third etching step and the fourth etching step of the mask layer etching process is changed from a large value into a small value. Therefore, the incident angle of the ions to the hole, having high energy and the plasma density, are changed, such that the bowing position is dispersed. As a result, the occurrence of the bowing is suppressed. In addition, the influence that the hole of SiON layer 53 becomes the taper shape is drastically reduced, thereby making it possible to effectively suppress the occurrence of the bowing. That is, when the excitation power is changed from a small value stage to a large value stage, and when a slight taper shape is present in the hole by the former small value stage of low excitation power, the ions having the strong energy due to the high excitation power is applied to the taper shape portion at the later large value stage. As a result, the attack force to the side wall of the hole is relatively large to easily cause the bowing. However, this case may be avoided in the present exemplary embodiment.

In the present exemplary embodiment, the processing times of the third etching step and the fourth etching step in the mask layer etching process are set to, for example, 60 sec and 84 sec, respectively. The processing time of the third etching step and the fourth etching step, and the conversion timing from the third etching step into the fourth etching step are determined based on the experience that repetitively performs the same processing.

In the present exemplary embodiment, after the fourth etching step in the mask layer etching process, a fifth etching step may be performed applying the third excitation power lower than the second excitation power. Therefore, since the bowing position finely moves, the occurrence of the bowing may be effectively suppressed. Each of the first excitation power and the second excitation power is in the range of, for example, 2100 W to 1900 W and 1600 W to 1400 W, respectively. Moreover, the third excitation power may be, for example, 1100 W to 900 W. In addition, the mask layer etching process may be formed of four or more processes. Even in this case, the excitation power may be changed from the higher value to the lower value. Therefore, the occurrence of the bowing may be effectively suppressed.

In the present exemplary embodiment, similar to the first exemplary embodiment, the processing pressure in the mask layer etching process is set to be the lower pressure than the processing pressure of the related art which is, for example, 20 mTorr (2.66 Pa). Also, the proper range of the power required for this exemplary embodiment is similar to that of the first exemplary embodiment.

Although the present disclosure is described with reference to the exemplary embodiments, it is not limited thereto.

Further, in each of the exemplary embodiments described above, the substrate subjected to the plasma processing is not limited to the wafer for semiconductor device, and, thus, may be various substrates used, for example, for flat panel displays (FPD) such as liquid crystal displays (LCDs), or may be a photomask, a CD substrate, and a print substrate, or the like.

In addition, the object of the present disclosure can be also achieved by supplying the storage medium storing the program code of the software implementing the functions of each of the above-described exemplary embodiments, to the system or the apparatus, and by reading the program stored in the storage medium by a computer (or CPU or MPU, etc.) of the system or the apparatus.

In this case, the program code itself read from the storage medium implements the functions of each of the exemplary embodiments described above, and the program code and the storage medium storing the program code configures the present disclosure.

In addition, as the storage medium for supplying the program code, for example, a floppy (registered trademark) disk, a hard disk, a magneto-optical disk, an optical disk such as CD-ROM, CD-R, CD-RW, DVD-ROM, DVD-RAM, DVD-RW, DVD+RW, a magnetic tape, a non-volatile memory card, and a ROM, may be used. Alternatively, the program code may be downloaded through the network.

In addition, the functions of each of the exemplary embodiments described above may be implemented by executing the computer-readable program code. And, an operating system (OS) operated on the computer, etc., may perform a portion or all of the actual processes based on the instruction of the program code, and the functions of each of the exemplary embodiments described above may also be implemented according to the processes by the operating system.

In addition, the program code read from the storage medium is recorded in a function extension board inserted into the computer or the memory included in the function extension unit connected to the computer, and, then, the expansion board having the extension function or the CPU, etc., included in the expansion unit executes a portion or all of the actual processes based on the instruction of the program code. And the functions of each exemplary embodiment as described above may also be implemented based on the process in the expansion board.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate processing method comprising:
receiving a substrate on which a mask layer and an intermediate layer are stacked over a target layer to be processed at a processing space;
generating plasma of a processing gas in the processing space; and
etching the substrate using the plasma, thereby forming a pattern shape in the target layer through the mask layer and the intermediate layer,
wherein pressure in the processing space is maintained at 7 mTorr ($9.31 \times 10^{-1}$ Pa) or less, and temperature of the substrate is maintained at 0° C. or less, and
the processing gas is a mixed gas containing oxygen ($O_2$) gas and COS gas, and a ratio of the COS gas to the mixed gas is 4.8 to 9.1 volume %.

2. The substrate processing method of claim 1, wherein an excitation power for generating the plasma is in the range of 450 W to 800 W.

3. The substrate processing method of claim 1, wherein the pressure in the processing space is 5 mTorr ($6.65 \times 10^{-1}$ Pa) or less.

4. The substrate processing method of claim 1, wherein the temperature of the substrate is in the range of −10° C. to −20° C.

5. The substrate processing method of claim 2, wherein the excitation power is in the range of 450 W to 550 W.

6. The substrate processing method of claim 2, wherein a bias power for infusing the plasma to the substrate is 0 W.

7. The substrate processing method of claim 1, wherein the mask layer is an amorphous carbon layer.

8. A substrate processing method comprising:
receiving a substrate on which a mask layer and an intermediate layer are stacked over a target layer to be processed at a processing space formed between an upper electrode and a lower electrode;
generating plasma of a processing gas in the processing space; and
etching the substrate using the plasma, thereby forming a pattern shape in the target layer through the mask layer and the intermediate layer,
wherein the etching includes a first etching step adapted to etch the mask layer by applying a DC voltage with the range of −150 to −600 V to the upper electrode, maintaining pressure in the processing space at 7 mTorr ($9.31 \times 10^{-1}$ Pa) or less, and maintaining an excitation power for generating the plasma in the range of 450 W to 800 W, and
a second etching step adapted to etch the mask layer by applying a DC voltage of 0 V to the upper electrode, maintaining the pressure in the processing space at 7 mTorr ($9.31 \times 10^{-1}$ Pa) or less, and maintaining the excitation power the range of 450 W to 800 W.

9. The substrate processing method of claim 8, wherein the excitation power in each of the first and second etching steps is in the range of 450 W to 550 W.

10. The substrate processing method of claim 8, wherein the mask layer is an amorphous carbon layer.

11. The substrate processing method of claim 8, wherein the processing gas is a mixed gas containing oxygen ($O_2$) gas and COS gas.

12. The substrate processing method of claim 11, wherein a ratio of the COS gas to the mixed gas is 4.8 to 9.1 volume %.

13. The substrate processing method of claim 8, wherein the pressure in the processing space in each of the first and second etching steps is 5 mTorr ($6.65 \times 10^{-1}$ Pa) or less.

14. A substrate processing method comprising:
receiving a substrate on which a mask layer and an intermediate layer are stacked over a target layer to be processed at a processing space;
generating plasma of a processing gas in the processing space; and
etching the substrate using the plasma, thereby forming a pattern shape in the target layer through the mask layer and the intermediate layer,
wherein the etching includes a third etching step adapted to etch the mask layer by applying a first excitation power for generating the plasma, and maintaining pressure in the processing space at 7 mTorr ($9.31 \times 10^{-1}$ Pa) or less, and
a fourth etching step adapted to etch the mask layer by applying a second excitation power lower than the first excitation power, and maintaining pressure in the processing space at 7 mTorr ($9.31 \times 10^{-1}$ Pa) or less.

15. The substrate processing method of claim 14, wherein each of the first excitation power and the second excitation power is in the range of 2100 W to 1900 W and in the range of 1600 W to 1400 W, respectively.

16. The substrate processing method of claim 14, wherein the etching further includes a fifth etching step adapted to etch the mask layer by applying a third excitation power lower than the second excitation power, and maintaining pressure in the processing space at 7 mTorr ($9.31 \times 10^{-1}$ Pa) or less.

17. The substrate processing method of claim 16, wherein the third excitation power is in the range of 1100 W to 900 W.

18. The substrate processing method of claim 14, wherein the pressure in the processing space is 5 mTorr ($6.65 \times 10^{-1}$ Pa) or less.

19. The substrate processing method of claim 14, wherein the mask layer is an amorphous carbon layer.

20. The substrate processing method of claim 14, wherein the processing gas is a mixed gas containing oxygen ($O_2$) gas and COS gas.

21. The substrate processing method of claim 20, wherein a ratio of the COS gas to the mixed gas is 4.8 to 9.1 volume %.

* * * * *